United States Patent
Hosking

(10) Patent No.: US 7,701,988 B2
(45) Date of Patent: Apr. 20, 2010

(54) OPTICAL TRANSMIT ASSEMBLY INCLUDING THERMALLY ISOLATED LASER, TEMPERATURE SENSOR, AND TEMPERATURE DRIVER

(75) Inventor: Lucy G. Hosking, Santa Cruz, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/110,236

(22) Filed: Apr. 20, 2005

(65) Prior Publication Data

US 2006/0239313 A1 Oct. 26, 2006

(51) Int. Cl.
*H01S 3/04* (2006.01)

(52) U.S. Cl. .......................... 372/34; 372/36

(58) Field of Classification Search .................. 372/34, 372/36; 428/641; 257/467; 398/14
See application file for complete search history.

(56) References Cited

U.S. PATENT DOCUMENTS

| | | | |
|---|---|---|---|
| 4,604,753 A | | 8/1986 | Sawai |
| 5,187,714 A | * | 2/1993 | Okazaki et al. ............... 372/36 |
| 5,415,978 A | * | 5/1995 | Asami et al. ................ 430/363 |
| 5,617,234 A | * | 4/1997 | Koga et al. .................... 398/14 |
| 5,706,302 A | * | 1/1998 | Shimizu ....................... 372/36 |
| 5,832,015 A | * | 11/1998 | Goto et al. .................... 372/34 |
| 6,126,311 A | | 10/2000 | Schuh |
| 6,253,097 B1 | | 6/2001 | Aronow et al. |
| 6,290,388 B1 | * | 9/2001 | Saul et al. ...................... 374/44 |
| 6,496,524 B2 | * | 12/2002 | Miyokawa et al. ............ 372/36 |
| 6,501,774 B2 | | 12/2002 | Kuwahara et al. |
| 6,546,030 B2 | * | 4/2003 | Sasao ........................... 372/36 |
| 6,807,206 B2 | * | 10/2004 | Tsukiji et al. ................. 372/34 |
| 6,934,448 B2 | | 8/2005 | Akashi et al. |
| 7,131,766 B2 | | 11/2006 | Sultan et al. |
| 7,154,372 B2 | | 12/2006 | Vanha et al. |
| 7,215,891 B1 | | 5/2007 | Chiang et al. |
| 2002/0105045 A1 | * | 8/2002 | Kawamura ................... 257/467 |
| 2002/0167065 A1 | | 11/2002 | Graf et al. |
| 2003/0157741 A1 | | 8/2003 | Oohata et al. |
| 2006/0239314 A1 | | 10/2006 | Hosking |
| 2006/0239315 A1 | | 10/2006 | Hosking |

OTHER PUBLICATIONS

Hosking, Lucy G., Electro-Optic Transducer Die Including A Temperature Sensing PN Junction, U.S. Appl. No. 11/110,112, filed Apr. 20, 2005.

* cited by examiner

*Primary Examiner*—Minsun Harvey
*Assistant Examiner*—Tuan N. Nguyen
(74) *Attorney, Agent, or Firm*—Workman Nydegger

(57) ABSTRACT

An optical transmit assembly in which a laser and temperature sensor are mounted on a first substrate without other heat generating components. Other heat generating components may be mounted on a second substrate that is separated from the first substrate by a thermally resistance mechanism. Accordingly, heat that is generated by other components is not as easily transferred to the laser and temperature sensor. This allows the temperature of the temperature sensor to more closely track the temperature of the laser, and allows for more efficient cooling of the laser.

13 Claims, 2 Drawing Sheets

OPTICAL TRANSMIT ASSEMBLY INCLUDING THERMALLY ISOLATED LASER, TEMPERATURE SENSOR, AND TEMPERATURE DRIVER

BACKGROUND OF THE RELATED ART

1. The Field of the Invention

The present invention relates generally to optical transmitters. More specifically, the present invention relates to an optical transmit assembly that includes a thermally isolated laser, temperature sensor, and temperature driver for efficient heat control of the laser.

2. Background and Related Art

Computing and networking technology have transformed our world. As the amount of information communicated over networks has increased, high speed transmission has become ever more critical. Many high speed data transmission networks rely on optical transceivers and similar devices for facilitating transmission and reception of digital data embodied in the form of optical signals over optical fibers. Optical networks are thus found in a wide variety of high speed applications ranging from as modest as a small Local Area Network (LAN) to as grandiose as the backbone of the Internet.

Typically, data transmission in such networks is implemented by way of an optical transmitter (also referred to as an electro-optic transducer), such as a laser or Light Emitting Diode (LED). The laser emits light when current is passed through it, the intensity of the emitted light being a function of the current magnitude passed through the laser. Information is conveyed over an optical fiber by transmitting different optical intensities onto the fiber.

The laser has strong temperature dependencies that can seriously affect performance, depending on the application. For example, in Dense Wavelength Division Multiplexed (DWDM) laser applications, different optical channels are transmitted simultaneously, each optical channel having a tight frequency range that the corresponding optical signal should stay within. Any variance outside of the frequency range could cause inter-symbol interference (ISI), seriously increasing the error rate of the transmission. Thus, in DWDM laser applications, it is critical that the laser's transmitted frequency be tightly controlled. Nevertheless, the frequency characteristics of a laser are heavily temperature-dependent. More specifically, the frequency characteristics of the optical emissions from the PN junction of the laser are heavily dependent on temperature. Thus, in DWDM laser applications, there is tight control of the temperature of the electro-optic transducer. Although DWDM has been discussed here, there are a wide variety of applications in which it may be desirable to accurately control the temperature of the emitting PN junction of the laser.

The temperature control of the laser typically relies on a temperature feedback system. Specifically, a temperature sensor is provided in proximity to the electro-optic transducer. Depending on the sensed temperature, a temperature driver then heats or cools the temperature sensor as appropriate until the temperature sensor detects a temperature within an acceptable temperature range. The aim here is that by tightly controlling the temperature of the temperature sensor, the temperature of the proximate laser will also be tightly controlled.

However, the temperature sensor and the laser cannot occupy the same space at the same time. Therefore, the temperature sensor, though relatively proximate to the laser, is still placed some finite distance from the laser. There will thus be some finite amount of thermal resistance between the temperature sensor and the laser. If there are significant heat generating sources that are nearby to the laser and/or temperature sensor, this thermal resistance could result in significant temperature differences between the temperature sensor and the laser. Furthermore, the heat generated by the laser (from its bias and modulation currents) may also cause temperature differences between the temperature sensor and the laser. Accordingly, even very tight control of the temperature of the temperature sensor will not necessarily result in tight control of the temperature of the laser. Furthermore, significant energy may need to be expended to cool the laser should the laser receive significant heat from surrounding components.

Accordingly, what would be advantageous are mechanisms in which there is tighter and more efficient control of the temperature of the laser in an optical transmit assembly.

BRIEF SUMMARY OF THE INVENTION

The foregoing problems with the prior state of the art are overcome by the principles of the present invention, which relate to an optical transmit assembly in which a laser and temperature sensor are mounted on a first substrate without other heat generating components. Other heat generating components may be mounted on a second substrate that is separated from the first substrate by a thermally resistance mechanism. Accordingly, heat that is generated by other components is not as easily transferred to the laser and temperature sensor.

This allows the temperature of the temperature sensor to more closely track the temperature of the laser, since the temperature of the laser and temperature sensor is less susceptible to dynamic temperature fluctuations caused by surrounding circuitry and changes in the laser bias and modulation currents. This allows the temperature driver thermally coupled to the temperature sensor to more tightly control the temperature of the laser. This, in turn, allows for tighter control over frequencies emitted by the laser. Furthermore, the temperature driver thermally coupled to the laser and temperature sensor uses less energy cooling the laser to the appropriate temperature. Therefore, the temperature control of the laser is power efficient.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention relate to an optical transmit assembly in which a laser and temperature sensor are mounted on a first substrate without other heat generating components. Other heat generating components may be mounted on a second substrate that is separated from the first substrate by a thermal resistance mechanism. Accordingly, heat that is generated by other components is not as easily transferred to the laser and temperature sensor. This allows the temperature of the temperature sensor to more closely track the temperature of the laser, thereby allowing tighter control of frequencies emitted by the laser, which is especially important in Dense Wavelength Division Multiplexed (DWDM) applications. Furthermore, the thermal separation of the laser and temperature sensor from surrounding heat generating components allows for more efficient cooling of the laser and temperature sensor.

While the optical transmit assembly will be described in some detail with respect to FIGS. 1 and 2, the optical transmit assembly is described by way of illustration only, and not by way of restricting the scope of the invention. The principles of the present invention are suitable for 1 G, 2 G, 4 G, 10 G and higher bandwidth fiber channels. Furthermore, the principles of the present invention may be implemented in laser transmitters of any form factor such as XFP, SFP and SFF, without restriction. The principles of the present invention may also be applied to an optical transmitter in any environment, even in an environment that includes an optical receiver. Accordingly, the principles of the present invention may be implemented in an optical transceiver environment.

Figure 1:
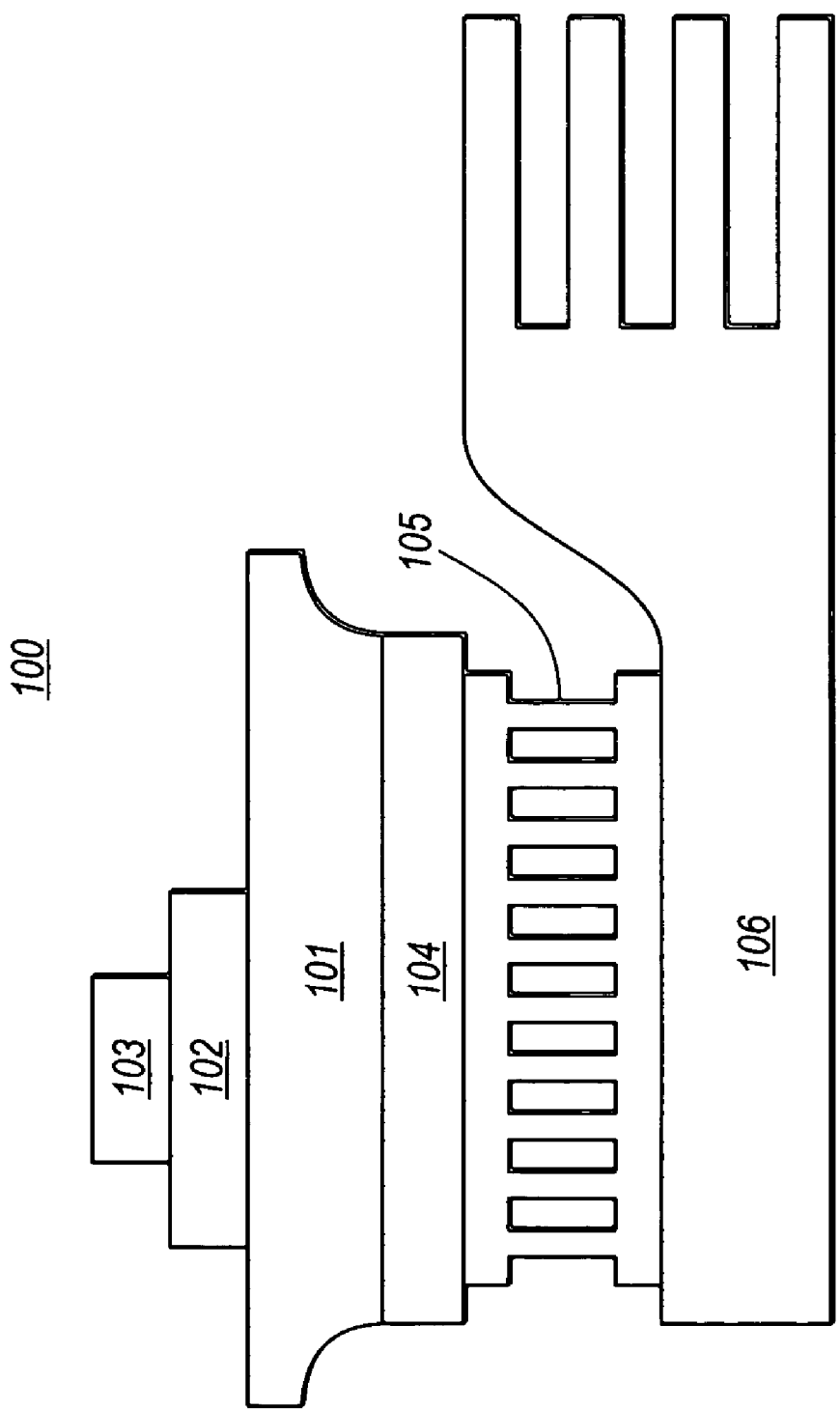
FIG. 1 illustrates a portion of an optical transmit assembly in which a laser and temperature sensor are mounted on a substrate that does not have other heat generating components also mounted thereon, and that includes a temperature driver for controlling the temperature of the laser and temperature sensor in accordance with the principles of the present invention.

FIG. 1 illustrates a portion 100 of an optical transmit assembly in which a laser 103 is structurally mounted on a substrate 101. In the illustrated case, a temperature sensor 102 is structurally coupled between the laser 103 and the substrate 101. This close proximity of the temperature sensor 102 to the laser 103 reduces the thermal resistance between the temperature sensor 102 and the laser 103 thereby facilitating more accurate temperature readings of the laser 103.

A temperature driver 105 is thermally coupled to the substrate 101. In order to allow uniform heat transfer with the lower surface of the substrate 101, a thermally conductive piece 104 may be positioned between the temperature driver 105 and the substrate 101. A heat sink 106 is thermally coupled to the temperature driver 105. Note that there are no other heat generating components (such as the laser driver circuit or other circuitry) mounted on the substrate 101.

Accordingly, there is high thermal resistance between the laser 103/temperature sensor 102 combination and the surrounding heat generating circuitry. In addition, there is low thermal resistance between the temperature sensor 102 and the laser 103. Both of these principles have the effect of allowing the temperature of the temperature sensor 102 to more closely track the temperature of the laser 103. Accordingly, the temperature driver 105 may more tightly control the temperature of the laser 103 by controlling the temperature of the temperature sensor 102. This allows for fine control of the frequencies emitted by the laser 103.

In addition, since there is high thermal resistance between the laser 103/temperature sensor 102 combination and the surrounding heat generating circuitry, it takes less power for the temperature driver 105 to cool the laser 103 to the appropriate temperature.

Figure 2:
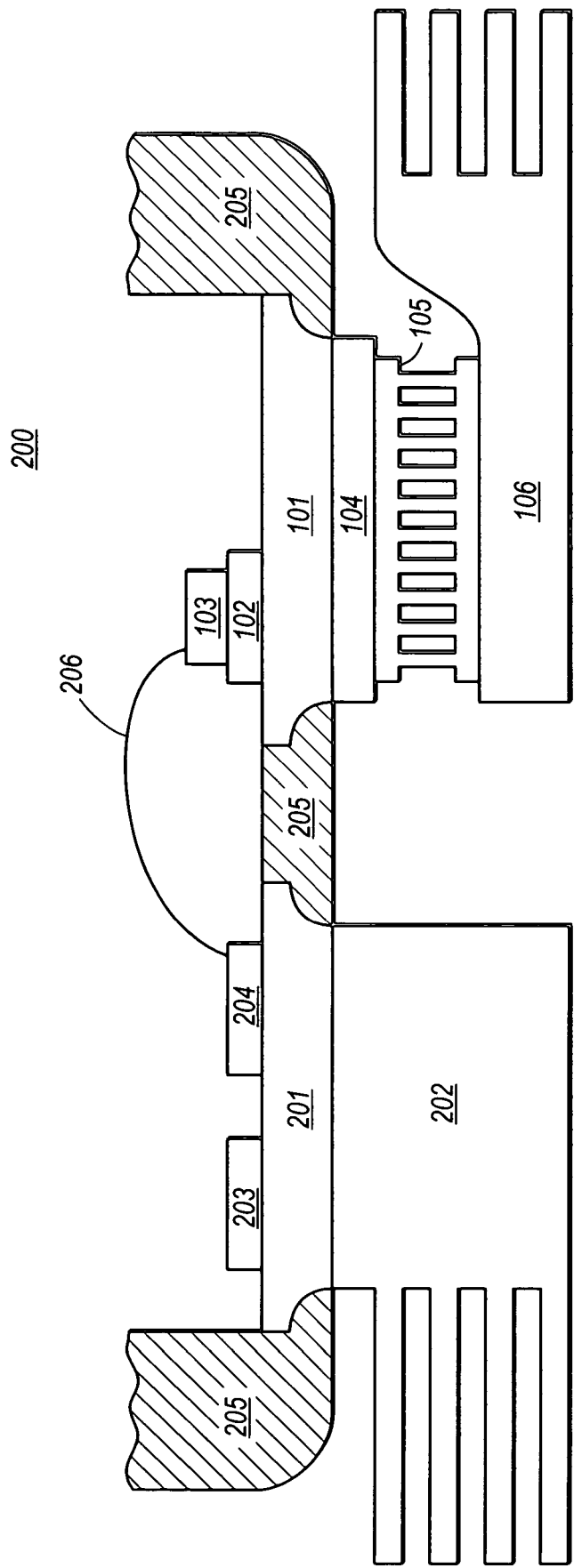
FIG. 2 illustrates a dual substrate optical transmit assembly that includes the portion of the optical transmit assembly of FIG. 1, and that further includes thermally isolated heat generating components mounted on a second substrate.

FIG. 2 illustrates an optical transmit assembly 200 that includes the portions described with respect to FIG. 1. In addition, the optical transmit assembly 200 includes a second substrate 201 that is thermally coupled to a heat sink 202. Heat generating components 203 and 204 are mounted on the second substrate 201. The heat generating components may include a laser driver 204 that is shown having an electrical connection 206 to the laser 103. In addition, there may be other heat generating components 203 mounted on the second substrate 201. A thermal resistance mechanism 205 provides thermal resistance between the first substrate 101 and the second substrate 201. For instance, the first and second substrates may be structurally bonded using any thermally insulating material. Accordingly, there is high thermal resistance between the heat generating circuitry and the laser. Furthermore, there is low thermal resistance through heat sink 202 between the heat generating circuitry and the environment. Thus, heat generated by the heat generating circuitry 203 and 204 has less effect on the temperature of the laser 103.

Accordingly, the principles of the present invention provide an optical transmit assembly in which the laser temperature may be more efficiently and tightly controlled. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. An optical transmit assembly comprising:
   one or more circuit components that emit heat therefrom;
   a first substrate upon which the one or more circuit components that emit heat are structurally mounted;
   a second substrate;
   a laser and temperature sensor structurally mounted on the substrate, the temperature sensor being structurally coupled between the laser and the substrate;
   a temperature driver thermally coupled to the second substrate; and
   a thermal resistance mechanism including a thermally insulating material, the thermal resistance mechanism structurally connecting the first substrate to the second substrate and providing thermal resistance between the first substrate upon which the one or more circuit components are structurally mounted and the combination of the second substrate, the laser and the temperature sensor such that heat that is generated by the one or more circuit components that emit heat therefrom is restricted by the thermal resistant mechanism from being transferred to the laser and temperature sensor, which allows the temperature of the temperature sensor to more closely track the temperatures of the laser since the temperature of the laser and temperature sensor is less susceptible to dynamic temperature fluctuations caused by surrounding circuitry and changes in the laser bias and modulation currents.

2. An optical transmit assembly in accordance with claim 1, further comprising a second heat sink to which the second substrate is thermally coupled.

3. An optical transmit assembly in accordance with claim 1, wherein the one or more circuit components comprise a laser driver that is electrically coupled to the laser.

4. An optical transmit assembly in accordance with claim 1, wherein the temperature sensor is mounted to the substrate, and the laser is mounted to the temperature sensor.

5. An optical transmit assembly in accordance with claim 4, wherein the second substrate comprises a first side and an opposing second side, the temperature sensor being mounted to the first side of the substrate and wherein the temperature driver is mounted to the second side of the substrate.

6. An optical transmit assembly in accordance with claim 1, wherein a thermally conductive piece is positioned between the temperature driver and the second substrate.

7. An optical transmit assembly in accordance with claim 1, wherein the temperature driver is thermally coupled with the laser.

8. An optical transmit assembly in accordance with claim 1, further comprising a first heat sink thermally coupled to the temperature driver.

9. An optical transmit assembly comprising:
    a first substrate having a top surface and a bottom surface, the bottom surface of the substrate being directly opposed to the top surface of the first substrate;
    a laser having a top surface and a bottom surface, the bottom surface of the laser being directly opposed to the top surface of the laser;
    a temperature sensor having a top surface and a bottom surface,
    the bottom surface of the laser being directly opposed to the top surface of the temperature sensor, the bottom surface of the temperature sensor being, in direct contact with a top surface of the first substrate and the top surface of the temperature sensor being in direct contact with the bottom surface of the laser such that the temperature sensor is sandwiched between the bottom surface of the laser and the top surface of the first substrate;
    a temperature driver thermally coupled to the first substrate;
    a second substrate separated from the first substrate by a thermal resistance mechanism; and
    one or more circuit components that emit heat therefrom, the one or more circuit components being structurally mounted on the second substrate;
    wherein the first and second substrate lie within the same plane in a side-by-side configuration with the thermal resistive connecting in between.

10. An optical transmit assembly in accordance with claim 9, wherein the temperature driver is thermally isolated from the second substrate.

11. An optical transmit assembly in accordance with claim 9, wherein the circuit components are thermally isolated from the laser and temperature sensor.

12. An optical transmit assembly in accordance with claim 9, wherein the first substrate is structurally bonded to the second substrate using a thermally insulating material.

13. An optical transmit assembly in accordance with claim 9, wherein the circuit components comprise a laser driver that is electrically coupled to the laser.

* * * * *